United States Patent
Johnston et al.

(10) Patent No.: US 10,699,725 B2
(45) Date of Patent: Jun. 30, 2020

(54) ADAPTIVE AUDIO ENCODER SYSTEM, METHOD AND ARTICLE

(71) Applicant: Immersion Services LLC, Renton, WA (US)

(72) Inventors: James D. Johnston, Redmond, WA (US); Stephen White, Woodinville, WA (US)

(73) Assignee: IMMERSION NETWORKS, INC., Renton, WA (US)

( * ) Notice: Subject to any disclaimer, the term of this patent is extended or adjusted under 35 U.S.C. 154(b) by 87 days.

(21) Appl. No.: 15/151,109

(22) Filed: May 10, 2016

(65) Prior Publication Data

US 2017/0330577 A1    Nov. 16, 2017

(51) Int. Cl.
*G10L 19/04* (2013.01)
*H03M 7/38* (2006.01)
*H03M 3/04* (2006.01)

(52) U.S. Cl.
CPC ............. *G10L 19/04* (2013.01); *H03M 3/042* (2013.01); *H03M 7/3046* (2013.01)

(58) Field of Classification Search
CPC ..... G10L 19/26; G10L 19/032; G10L 19/167; G10L 19/0208
See application file for complete search history.

(56) References Cited

U.S. PATENT DOCUMENTS

| | | | | |
|---|---|---|---|---|
| 5,845,244 A | * | 12/1998 | Proust | G10L 19/06 704/200.1 |
| 5,974,380 A | * | 10/1999 | Smyth | G10L 19/0208 704/201 |
| 5,978,762 A | * | 11/1999 | Smyth | G10L 19/0208 704/200.1 |
| 6,493,664 B1 | | 12/2002 | Udaya Bhaskar et al. | |
| 6,975,254 B1 | | 12/2005 | Sperschneider et al. | |
| 7,394,410 B1 | * | 7/2008 | Wegener | H03M 7/30 341/50 |
| 2007/0088541 A1 | * | 4/2007 | Vos | G10L 19/0208 704/219 |

(Continued)

OTHER PUBLICATIONS

Dubnowski et al (Microprocessor Log PCM/ADPMC code converter, IEEE Transactions on Communications, vol. COM-26, No. 5, May 1978, pp. 660-664).*

(Continued)

*Primary Examiner* — Michael N Opsasnick
(74) *Attorney, Agent, or Firm* — Jackson Walker LLP; Christopher J. Rourk

(57) ABSTRACT

An encoder includes a low-pass filter to filter input audio signals. The low-pass filter has fixed filter coefficients. The encoder generates quantized signals based on a difference signal. The encoder includes an adaptive quantizer and a decoder to generate feedback signals. The decoder has an inverse quantizer and a predictor. The predictor has fixed control parameters which are based on a frequency response of the low-pass filter. The predictor may include a finite impulse response filter having fixed filter coefficients. The decoder may include an adaptive noise shaping filter coupled between the low-pass filter and the encoder. The adaptive noise shaping filter flattens signals within a frequency spectrum corresponding to a frequency spectrum of the low-pass filter.

34 Claims, 10 Drawing Sheets

(56) References Cited

U.S. PATENT DOCUMENTS

| | | | |
|---|---|---|---|
| 2007/0088558 A1* | 4/2007 | Vos | G10L 19/0208 704/275 |
| 2007/0118362 A1 | 5/2007 | Kondo | |
| 2007/0146185 A1* | 6/2007 | Kang | H03H 17/0416 341/143 |
| 2008/0126086 A1* | 5/2008 | Vos | G10L 19/0208 704/225 |
| 2009/0254783 A1 | 10/2009 | Hirschfeld et al. | |
| 2011/0224995 A1 | 9/2011 | Kovesi et al. | |
| 2014/0229186 A1 | 8/2014 | Mehrotra et al. | |
| 2015/0371653 A1* | 12/2015 | Pilli | G10L 21/0364 704/206 |
| 2017/0330572 A1* | 11/2017 | Johnston | G10L 19/032 |
| 2017/0330574 A1* | 11/2017 | Johnston | G10L 19/167 |
| 2017/0330575 A1* | 11/2017 | Johnston | G10L 19/167 |
| 2017/0330577 A1* | 11/2017 | Johnston | G10L 19/26 |

OTHER PUBLICATIONS

Kroon et al, "A Class of Analysis-by-Synthesis Predictive Coders", 1988, pp. 353-363, IEEE Journal on Selected Areas in COmmunications, vol. 6, No. 2.*

3GPP2C.S0014-0V1.0, Enhanced Variable Rate Codec (EVRC), 139 pages.*

Dietrich, "Perfomrance and Implementation of a Robust ADPCM Algorithm for Wideband Speech Coding with 64 kbit/s", Proc. International Zurich Seminar Digital Communicat., Jan. 1, 1984, pp. 15-21.

Crochiere, "Digital Signal Processor: Sub-band coding", Bell System Technical Journal, AT and T, Short Hills, NY, US, vol. 7, No. 7, Sep. 1, 1981, pp. 1633-1653.

Ramamoorthy, et al., "Enhancement of ADPCM Speech Coding with Backward-Adaptive Algorithms for Postfiltering and Noise Feedback", ACM Transactions on Computer Systems (TOCS), Association for Computing Machinery, Inc. US, vol. 6, No. 2, Feb. 1, 1988, pp. 364-382.

Atal, et al., "Adaptive Predictive Coding of Speech Signals" Bell System Technical Journal, AT and T, Short Hills, NY, US, vol. 49, No. 8, Oct. 1, 1970, pp. 1973-1986.

Holters, et al., "Delay-Free Lossy Audio Coding Using Shelving Pre and Post-Filters", Acoustics, Speech and Signal Processing, 2008, ICASSP 2008, IEEE International Conference on IEEE, Piscataway, NJ, USA, Mar. 31, 2008, pp. 209-212.

Jayant, "Adaptive Post-Filtering of ADPCM Speech", Bell System Technical Journal, AT and T, Short Hills, NY, US, vol. 60, No. 5, May 1, 1981, pp. 707-717.

"7 kHz Audio-Coding Within 64 KBIT/S", ITU-T Standard, International Telecommunication Union, Geneva, CH, No. G.722, Nov. 25, 1988, pp. 1-75.

Notification Concerning Transmittal of International Preliminary Report on Patentability dated Nov. 22, 2018 from the International Bureau of WIPO containing the Written Opinion of the International Searching Authority—EPO—for International Application No. PCT/US2017/031735, 21 pages.

Office Action dated Dec. 18, 2018 issued by the European Patent Office for EP17724255.9, 3 pages.

* cited by examiner

ADAPTIVE AUDIO ENCODER SYSTEM, METHOD AND ARTICLE

CROSS-REFERENCE TO RELATED APPLICATIONS

The present application was filed on May 10, 2016 along with related U.S. patent application Ser. Nos. 15/151,200, 15/151,211, and 15/151,220, and entitled, "ADAPTIVE AUDIO CODEC SYSTEM, METHOD AND ARTICLE."

BACKGROUND

Technical Field

The description relates to systems, methods and articles to encode and decode audio signals.

Description of the Related Art

Differential pulse code modulation (DPCM) may be used to reduce the noise level or the bit rate of an audio signal. A difference between an input audio signal and a predictive signal may be quantized to produce an output encoded data stream of a reduced energy. The predictive signal of an encoder may be generated using a decoder including an inverse quantizer and a prediction circuit. Adaptive differential pulse code modulation (ADPCM) varies a size of a quantization step of the quantizer (and inverse quantizer) to increase the efficiency in view of a varying dynamic range of an input signal.

BRIEF SUMMARY

In an embodiment, an apparatus comprises: a low-pass filter having determined filter coefficients and configured to filter an input signal; an encoder configured to generate a quantized signal based on a difference signal and including: an adaptive quantizer; and a decoder configured to generate a feedback signal and having an inverse quantizer and a predictor circuit, the predictor circuit having determined control parameters based on a frequency response of the low-pass filter. In an embodiment, the determined filter coefficients of the low-pass filter are fixed filter coefficients of the low-pass filter, the predictor circuit comprises a finite impulse response (FIR) filter and the determined control parameters of the predictor circuit comprise fixed filter coefficients of the FIR filter. In an embodiment, the apparatus comprises: an adaptive noise shaping filter coupled between the low-pass filter and the encoder, the adaptive noise shaping filter being configured to flatten signals within a frequency spectrum corresponding to a frequency spectrum of the low-pass filter. In an embodiment, the adaptive noise shaping filter is configured to not flatten frequencies above an edge frequency of the low-pass filter. In an embodiment, the edge frequency is 25 kHz. In an embodiment, the adaptive noise shaping filter generates a signal indicative of filter coefficients of the adaptive noise shaping filter, the signal indicative of filter coefficients of the adaptive noise shaping filter being included in a bit stream output by the encoder. In an embodiment, the encoder includes coding circuitry configured to generate code words based on quantized signal words generated by the adaptive quantizer. In an embodiment, the coding circuitry is configured to generate an escape code in response to at least one of: a quantized signal word not being associated with a corresponding coding code word; an end of a signal channel of a signal to be encoded; and an end of the signal to be encoded. In an embodiment, the coding circuitry is configured to use Huffman coding to generate the code words. In an embodiment, the adaptive quantizer is a variable rate quantizer. In an embodiment, a step size and bit rate of the quantized signals generated by the adaptive quantizer are variable. In an embodiment, the adaptive quantizer is configured to control a step size according to:

$$d_{n+1} = \beta d_n + m(c_n/L_{factor}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, and $d_{n+1}$ corresponds to a step size in the log domain to be applied to a next quantized signal word $c_{n+1}$. In an embodiment, the adaptive quantizer is configured to control a step size according to:

$$d_{n+1} = \max(\beta d_n + m(c_n/L_{factor}), d_{min}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, $d_{min}$ is a threshold step size in the log domain, and $d_{n+1}$ corresponds to a step size in the log domain to be applied to a next quantized signal word $c_{n+1}$.

In an embodiment, a method comprises: filtering an input signal, the filtering including using a low-pass filter having determined filter coefficients; and encoding the filtered input signal using a feedback loop, the encoding including: generating a quantized signal based on a difference signal using an adaptive quantizer; generating a feedback signal based on the quantized signal using an inverse quantizer and a predictor circuit having determined control parameters based on a frequency response of the low-pass filter; and generating the difference signal based on the feedback signal and the filtered input signal. In an embodiment, the determined filter coefficients of the low-pass filter are fixed filter coefficients of the low-pass filter, the predictor circuit comprises a finite impulse response (FIR) filter and the determined control parameters of the predictor circuit comprise fixed filter coefficients of the FIR filter. In an embodiment, the filtering includes using an adaptive noise shaping filter to filter a signal output by the low-pass filter, the adaptive noise shaping filter flattening signals within a frequency spectrum corresponding to a frequency spectrum of the low-pass filter. In an embodiment, the method comprises: generating a signal indicative of filter coefficients of the adaptive noise shaping filter and including the signal indicative of filter coefficients of the adaptive noise shaping filter in an encoded bit stream. In an embodiment, the method comprises: generating code words based on quantized signal words generated by the adaptive quantizer. In an embodiment, the method comprises: generating an escape code in response to at least one of: a quantized signal word not being associated with a corresponding coding code word; an end of a signal channel of a signal to be encoded; and an end of the signal to be encoded. In an embodiment, the method comprises: controlling a step size of the adaptive quantizer according to:

$$d_{n+1} = \max(\beta d_n + m(c_n/L_{factor}), d_{min}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, $d_{min}$ is a threshold step size in the log domain, and $d_{n+1}$ corresponds to a step size in the log domain to be applied to a next quantized signal word $c_{n+1}$.

In an embodiment, a non-transitory computer-readable medium's contents configure signal processing circuitry to perform a method, the method comprising: filtering an input signal, the filtering including low-pass filtering using determined filter coefficients; and encoding the filtered input signal using feedback, the encoding including: generating a quantized signal based on a difference signal; generating a prediction signal based on the quantized signal using determined control parameters based on a frequency response of the low-pass filtering; and generating the difference signal based on the prediction signal and the input signal. In an embodiment, the determined filter coefficients of the low-pass filtering are fixed filter coefficients of a low-pass filter, the generating the predictor signal comprises using a finite impulse response (FIR) filter and the determined control parameters comprise fixed filter coefficients of the FIR filter. In an embodiment, the filtering includes adaptive noise shaping to flatten signals within a frequency spectrum corresponding to a frequency spectrum of the low-pass filter. In an embodiment, the method comprises: controlling a step size of the generating of the quantized signal according to:

$$d_{n+1} = \max(\beta d_n + m(c_n/L_{factor}), d_{min}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, $d_{min}$ is a threshold step size in the log domain, and $d_{n+1}$ corresponds to a step size in the log domain to be applied to a next quantized signal word $c_{n+1}$.

In an embodiment, a system comprises: an encoder, including: a low-pass filter having determined filter coefficients and configured to filter an input signal; an adaptive quantizer configured to generate a quantized signal based on a difference signal; an inverse quantizer; and a predictor circuit, the inverse quantizer being coupled between the adaptive quantizer and the predictor circuit with the predictor circuit having determined control parameters based on a frequency response of the low-pass filter; and a decoder configured to decode signals encoded by the encoder. In an embodiment, the determined filter coefficients of the low-pass filter are fixed filter coefficients of the low-pass filter, the predictor circuit comprises a finite impulse response (FIR) filter and the determined control parameters of the predictor circuit comprise fixed filter coefficients of the FIR filter. In an embodiment, the system comprises: an adaptive noise shaping filter coupled between the low-pass filter and the adaptive quantizer, the adaptive noise shaping filter being configured to flatten signals within a frequency spectrum corresponding to a frequency spectrum of the low-pass filter. In an embodiment, the adaptive noise shaping filter generates a signal indicative of filter coefficients of the adaptive noise shaping filter, the signal indicative of filter coefficients of the adaptive noise shaping filter being included in a bit stream output by the encoder to the decoder. In an embodiment, the encoder includes coding circuitry configured to generate code words based on quantized signal words generated by the adaptive quantizer and the decoder includes decoding circuitry configured to generate quantized signal words based on code words generated by the coding circuitry. In an embodiment, the coding circuitry and the decoding circuitry are configured to use escape coding.

In an embodiment, a system comprises: an input filter having determined control parameters and configured to limit a bandwidth of an input signal to less than seventy-five percent of the available bandwidth based on a sampling frequency of the input signal; an encoder configured to generate quantized signals based on a difference signal and including: an adaptive quantizer; and feedback circuitry configured to generate feedback signals and having an inverse quantizer and a predictor circuit, the predictor circuit having determined control parameters based on a frequency response of the input filter. In an embodiment, the system comprises: a decoder configured to decode signals encoded by the encoder. In an embodiment, the input filter is a low-pass filter, the determined control parameters of the low-pass filter are fixed filter coefficients of the low-pass filter, the predictor circuit comprises a finite impulse response (FIR) filter and the determined control parameters of the predictor circuit comprise fixed filter coefficients of the FIR filter. In an embodiment, wherein the input filter is a band-pass filter, the determined control parameters of the band-pass filter are fixed filter coefficients of the band-pass filter, the predictor circuit comprises a finite impulse response (FIR) filter and the determined control parameters of the predictor circuit comprise fixed filter coefficients of the FIR filter.

In an embodiment, a system comprises: means for low-pass filtering an input signal using determined filtering parameters; means for generating a quantized signal based on a difference signal; means for generating a prediction signal based on the quantized signal using determined control parameters based on a frequency response of the means for low-pass filtering; and means for generating the difference signal. In an embodiment, the system comprises: means for decoding coded signals. In an embodiment, the means for low-pass filtering comprises a low-pass filter having fixed filter coefficients and the means for predicting comprises a finite impulse response (FIR) filter having fixed filter coefficients based on the filter coefficients of the low-pass filter.

DETAILED DESCRIPTION

Figure 1:
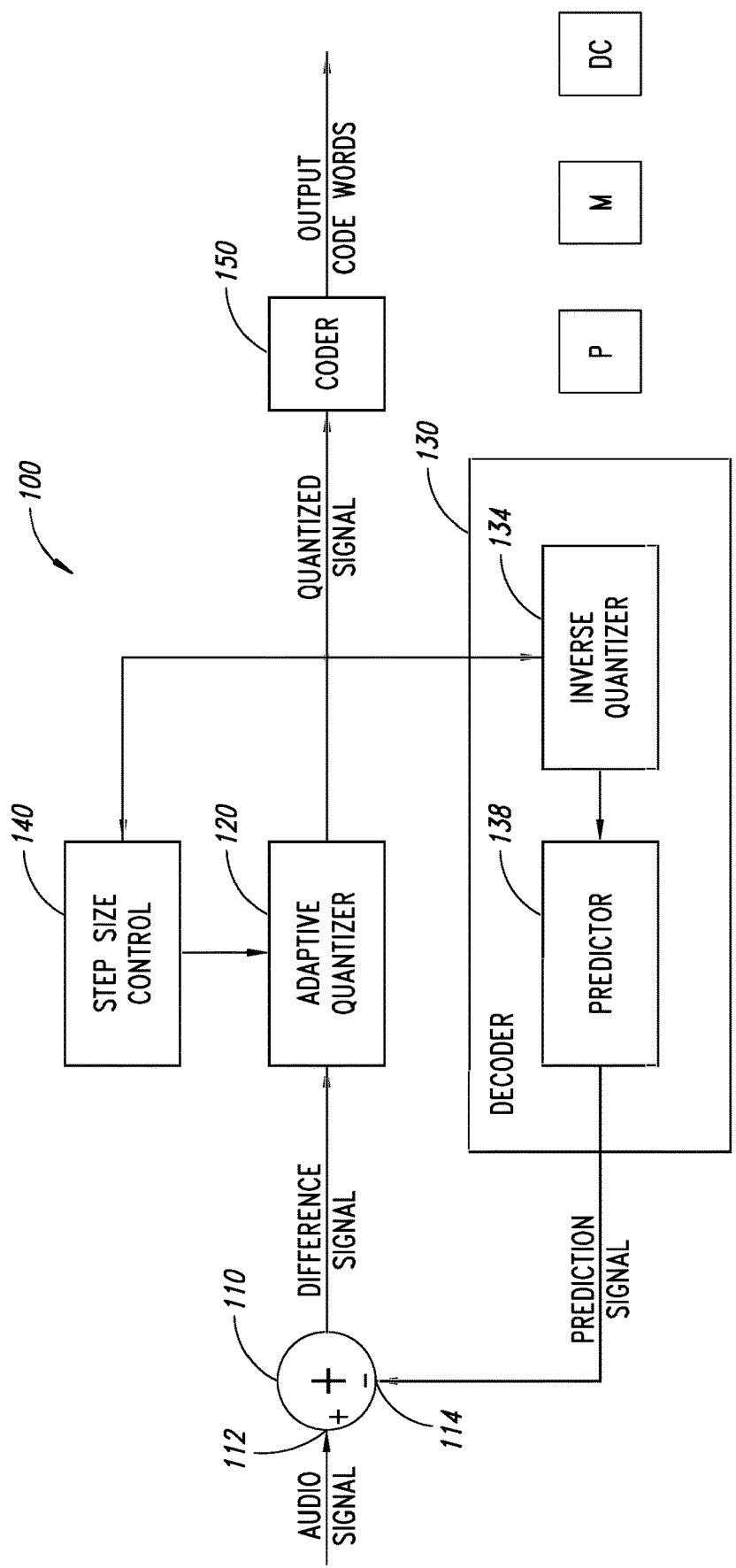
FIG. 1 is a functional block diagram of an embodiment of an ADPCM encoder.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, finite impulse response filters, encoders, decoders, audio and digital signal processing circuitry, etc., such as transistors, multipliers, integrated circuits, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

Reference throughout this specification to "one embodiment," or "an embodiment" means that a particular feature, structure or characteristic described in connection with the embodiment is included in at least one embodiment. Thus, the appearances of the phrases "in one embodiment," or "in an embodiment" in various places throughout this specification are not necessarily referring to the same embodiment, or to all embodiments. Furthermore, the particular features, structures, or characteristics may be combined in any suitable manner in one or more embodiments to obtain further embodiments.

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

FIG. 1 is a functional block diagram of an embodiment of audio signal encoder 100 which may employ adaptive differential pulse-code modulation (ADPCM). As illustrated in FIG. 1, the encoder 100 has an adder circuit 110, an adaptive quantizer circuit 120, a decoder circuit 130 including an inverse quantizer circuit 134 and a predictor circuit 138, a quantizer step size control circuit 140, and an optional coder circuit 150.

In operation of an embodiment, an analog input audio signal to be encoded is received at a positive input 112 of the adder 110 of the encoder 100. A negative input 114 of the adder 110 receives a prediction signal generated by the decoder 130 as a feedback signal. The adder 110 generates a difference signal which is provided to the adaptive quantizer circuit 120. The adaptive quantizer circuit 120 may be an analog to digital converter which samples the received difference signal and generates an output signal representing the difference signal as a series of quantized signals representing different signal levels. For example, 8-bit words may be used to represent 256 different signal levels (e.g., 256 different steps having a uniform step size); 4 bits words may be used to represent 16 different signal levels; etc. Optionally, coding, such as Huffman coding and/or arithmetic coding, may be employed on the quantized signal in an embodiment, by coding circuit 150, generating a coded signal output. The quantized signal output by the adaptive quantizer circuit 120 (or of the optional coder 150 when a coder is employed) is the output quantized signal or code words of the encoder 100. The quantizer step size control circuit 140 generates control signals to control a size of the quantization steps employed by the quantizer 120 (and the inverse quantizer 134), which may be varied to facilitate efficient transmission, storage, etc., in view of an input audio signal having a varying dynamic range.

The inverse quantizer 134 of the decoder 130 generates a signal, such as an analog signal, based on the quantized signal output by the adaptive quantizer and the current step size control signal set by the quantizer step size control circuit 140. The predictor circuit 138 may generate the prediction signal based on the output signal of the inverse quantizer 134 and historical data, such as recent quantized signal values and recent prediction signal values. One or more filters and one or more feedback loops may be employed by the predictor circuit 138.

As illustrated, the encoder 100 of FIG. 1 comprises one or more processors or processor cores P, one or more memories M, and discrete circuitry DC, which may be used alone or in various combinations to implement the functionality of the encoder 100. In operation, an embodiment of the encoder 100 generates quantized and, optionally, coded data from an input analog audio signal. In operation of an embodiment, a digital audio signal to be encoded (e.g., to a reduced bitstream, may be received at the positive input 112 instead of an analog signal (e.g., an 8-bit digital audio signal may be encoded as a 4-bit digital audio signal).

Although the components of the encoder 100 of FIG. 1 are illustrated as separate components, the various components may be combined (e.g., the quantizer step size control circuit 140 may be integrated into the adaptive quantizer 120 in some embodiments) or split into additional components (e.g., the predictor circuit 138 may be split into multiple predictor circuits, may be split into separate components, such as filters, adders, buffers, look-up tables, etc.) and various combinations thereof.

Figure 2:
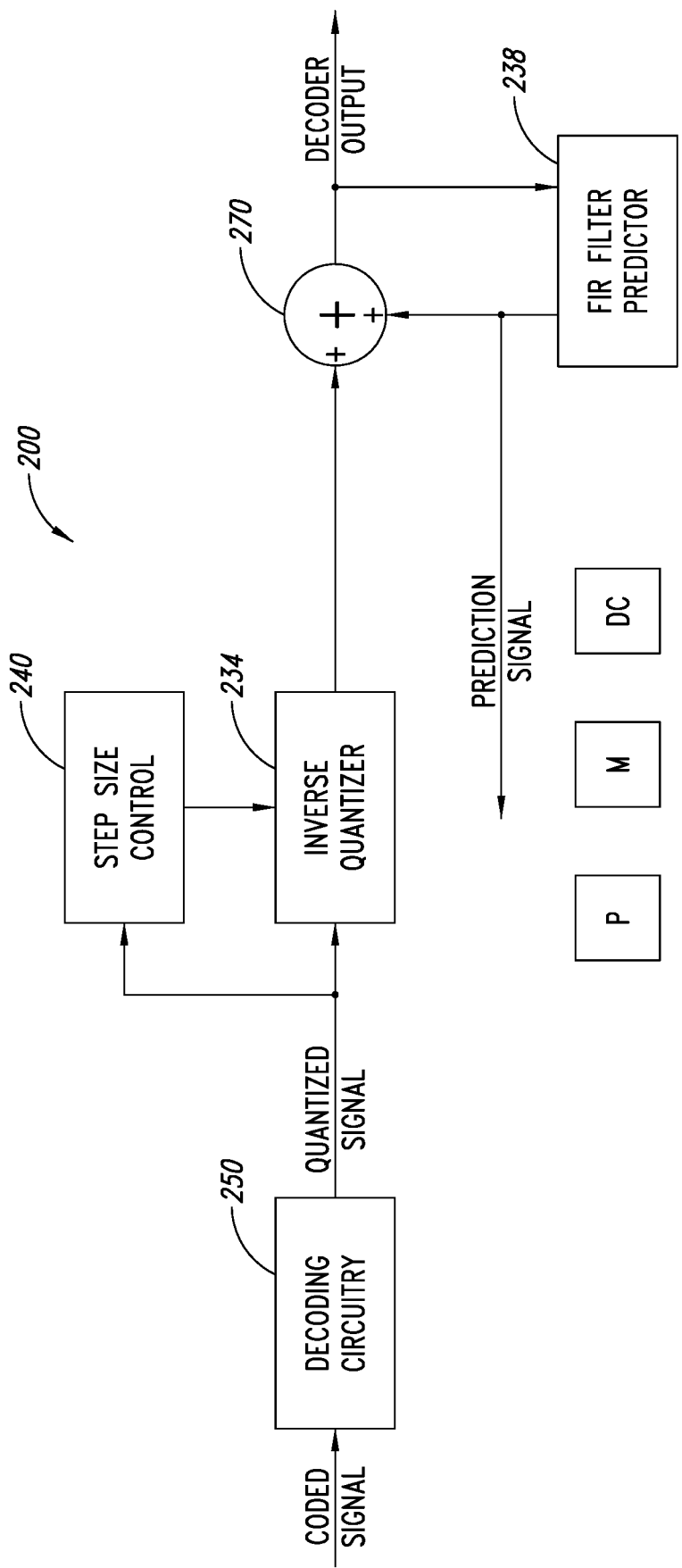
FIG. 2 is a functional block diagram of an embodiment of an ADPCM decoder.

FIG. 2 is a functional block diagram of an embodiment of an audio signal decoder 200 which may employ adaptive differential pulse-code modulation (ADPCM). The decoder 200 may be employed, for example, as the decoder 130 of FIG. 1, as a separate decoder to decode a received encoded signal, etc. As illustrated in FIG. 2, the decoder 200 has optional decoding circuitry 250, an inverse quantizer circuit 234, a predictor circuit 238, an inverse quantizer step size control circuit 240 and an adder 270.

In operation of an embodiment, a coded signal is received by the decoding circuitry 250, which converts the coded signal into a quantized signal. The quantized signal to be decoded is provided to the inverse quantizer 234 and to the inverse quantizer step size control circuit 240. When the decoder 200 is employed in an encoder, such as the encoder 100 of FIG. 1, the decoding circuitry 250 may typically be omitted and the same step size control circuit may be used to provide a step size control signal to the quantizer and to the inverse quantizer (see, FIG. 1). The inverse quantizer 234 generates a signal, such as an analog signal, based on the quantized signal output by the decoding circuitry 250 (or received from a quantizer (see quantizer 120 of FIG. 1)) and the current step size set by the inverse quantizer step size control circuit 240. The output of the inverse quantizer 234 is provided to a first positive input of the adder 270. The output of the adder is provided to the predictor 238, which as illustrated comprises a Finite Impulse Response (FIR) filter. An output of the FIR filter is provided to a second positive input of the adder 270.

When the decoder 200 is employed as a decoder to provide a decoded signal as an output, the output of the decoder 200 is the output of the adder 270. When the decoder 200 is employed in an encoder as part of a feedback loop, such as the decoder 130 used in the encoder 100 of FIG. 1, the output of the predictor circuit 238 provides the prediction signal to the encoder (see the prediction signal provided to the negative input 114 of the adder 110 of FIG. 1).

The inverse quantizer 234, the inverse quantizer step size control circuit 240 and the predictor circuit 238 may typically operate in a similar manner to the corresponding components of an encoder, such as the encoder 100 of FIG. 1. For example, with reference to FIGS. 1 and 2, having the corresponding components operate in a similar manner in the encoder 100 and the decoder 200 facilitates using the quantized signal to generate the prediction signal and to control the step size in both the encoder 100 and the decoder 200, without needing to exchange additional control signals between the encoder 100 and the decoder 200.

As illustrated, the decoder 200 of FIG. 2 comprises one or more processors or processor cores P, one or more memories M, and discrete circuitry DC, which may be used alone or in various combinations to implement the functionality of the decoder 200. Although the components of the decoder 200 of FIG. 2 are illustrated as separate components, the various components may be combined (e.g., the inverse quantizer step size control circuit 240 may be integrated into the inverse quantizer 234 in some embodiments) or split into additional components (e.g., the predictor circuit 238 may be split into separate components, such as filters, adders, buffers, look-up tables, etc.) and various combinations thereof.

Figure 3:
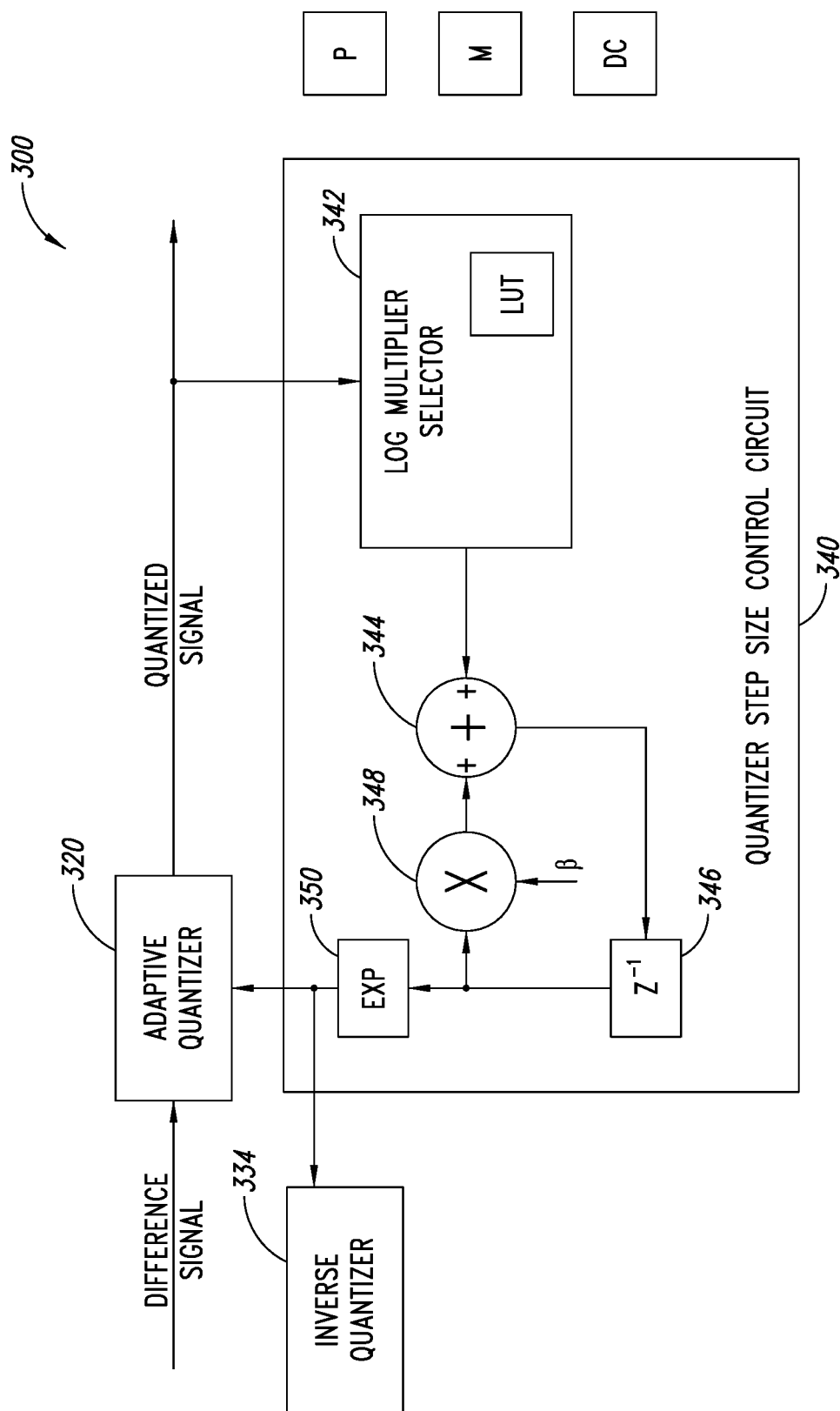
FIG. 3 is a functional block diagram of an embodiment of a quantizer step size control circuit.

FIG. 3 is a functional block diagram of an embodiment of a quantizer step size control circuit 340, which may be employed, for example, in the embodiment of the encoder 100 of FIG. 1 as the quantizer step size control circuit 140, or in the embodiment of the decoder 200 of FIG. 2 as the inverse quantizer step size control circuit 240. As illustrated, the quantizer step size control circuit 340 comprises a log multiplier selector 342 which selects a log multiplier based on a current quantized signal word, as illustrated a word output by an adaptive quantizer 320. In some embodiments, the current quantized signal word may be included in a bit stream being decoded by a decoder (see FIG. 2). The log multiplier selector 342 may select a log multiplier based on historical data, such as previous quantized signal words, and may comprise a look-up table LUT, which may be updatable, for example, based on historical data, in a update download, etc. The log multiplier selector 342 may select a log multiplier based on statistical probabilities based on current and previous quantized signal words. The quantizer step size control circuit 340 comprises an adder 344 which receives at a first positive input the selected log multiplier, and provides an output to a delay circuit 346. The output of the delay circuit 346 is provided to a multiplier 348 and to an exponential circuit 350. The multiplier 348 multiplies the output of the delay circuit 346 by a scaling or leakage factor β, which may typically be close to and less than 1, and provides the result to a second positive input of the adder 344. The leakage factor may typically be a constant, but may be variable in some embodiments, for example, based on the previous step size control signal or other historical data. The selection of a scaling factor β as close to and less than 1 facilitates reducing the impact of selection of an incorrect step size, for example due to a transmission error, as the introduced error will decay away.

The exponential circuit 350, in operation, generates a step-size control signal based on the output of the delay circuit 346. As illustrated, the step-size control signal is provided to the adaptive quantizer 320 and to an inverse quantizer 334. As illustrated, the quantizer step size control circuit 340 operates in a logarithmic manner, which may simplify the calculations. Some embodiments may operate in a linear manner, and may, for example, employ a multiplier instead of the adder 244, and an exponential circuit instead of the multiplier 246. The quantizer step-size control circuit 340 as illustrated operates in a logarithmic manner, and the step sizes selected based on the step size control signal vary in an exponential manner.

In an embodiment, the quantizer step size control circuit 340 may operate in accordance with equation 1, below:

$$d_{n+1} = \beta d_n + m(c_n) \quad \text{Equation 1}$$

where $d_n$ is the step size in the log domain, $m(c_n)$ is the log multiplier selected based on the current quantized signal, and β is the scaling factor or leakage coefficient. As illustrated, FIG. 3 comprises one or more processors P, one or more memories M, and discrete circuitry DC, which may be used alone or in various combinations to implement the functionality of the quantizer step size control circuit 340.

Although the components of FIG. 3 are illustrated as separate components, the various components may be combined (e.g., the adder 344 and the multiplier 348 may be integrated into an arithmetic processor in some embodiments) or split into additional components, and various combinations thereof.

Figure 4:
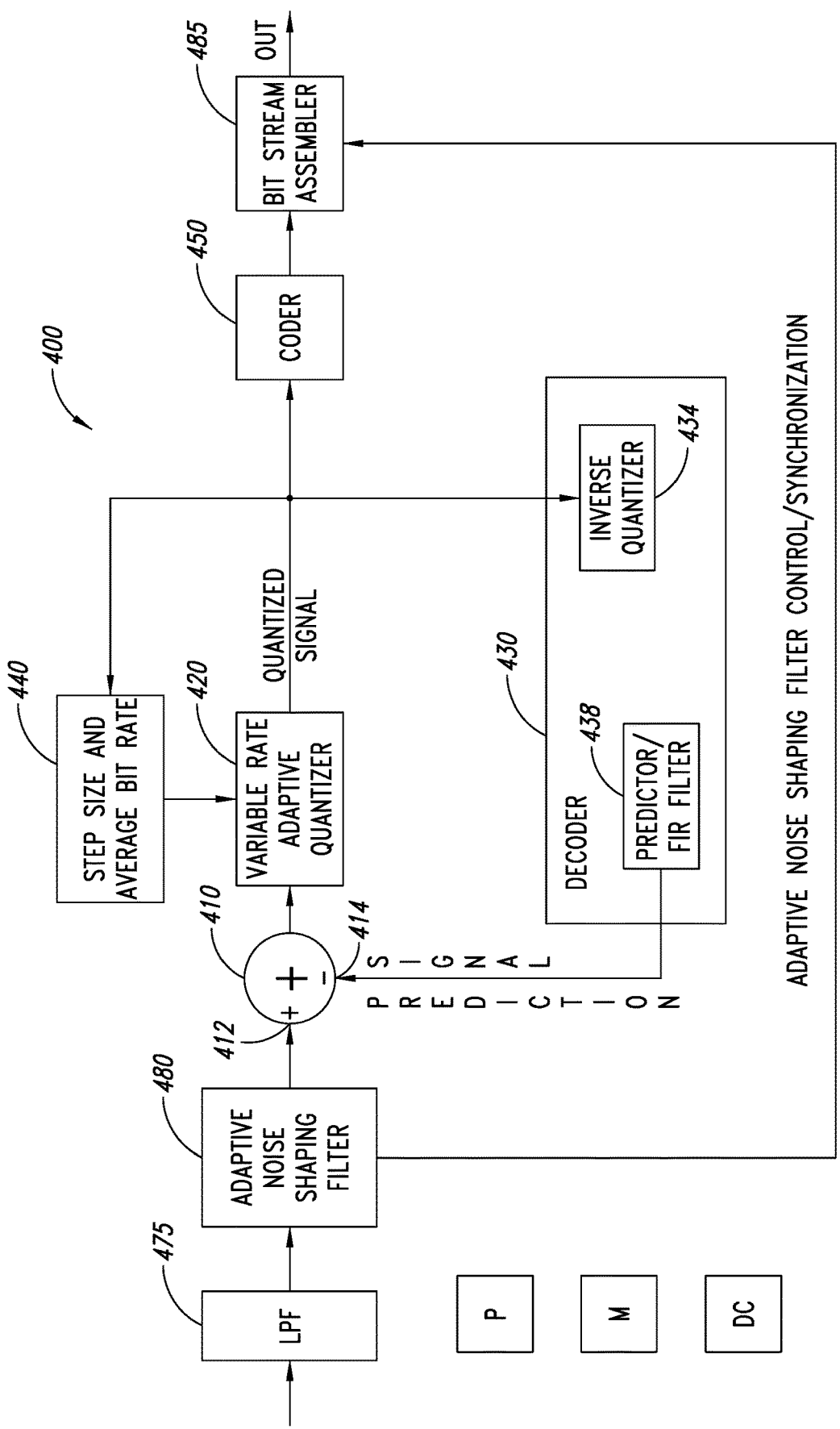
FIG. 4 is a functional block diagram of an embodiment of an ADPCM encoder.

FIG. 4 is a functional block diagram of an audio signal encoder 400 which may employ adaptive differential pulse-code modulation (ADPCM). The audio signal encoder 400 of an embodiment provides added bandwidth control, facilitates avoiding quantizer overload, and includes adaptive noise shaping. As illustrated in FIG. 4, the encoder 400 has a low pass filter 475, an adaptive noise shaping filter 480, an adder circuit 410, a variable-rate adaptive quantizer circuit 420, a decoder circuit 430 including an inverse quantizer circuit 434 and a predictor circuit 438, a quantizer step size and average bit rate control circuit 440, a coder 450 and bit stream assembler 485.

Figure 5:
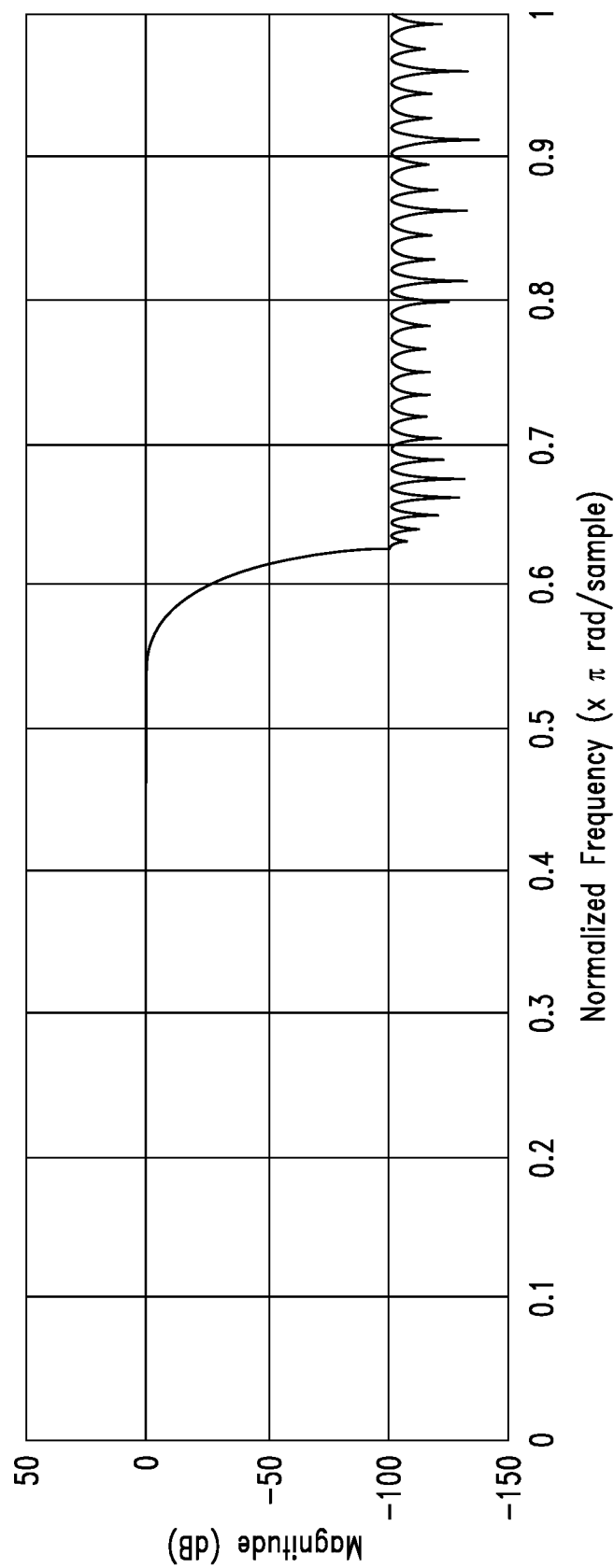
FIG. 5 illustrates an example frequency response of an embodiment of a low pass filter.

In operation of an embodiment, an analog input audio signal to be encoded is received at an input of an input filter, as illustrated the low pass filter 475. The low pass filter 475 facilitates improving the signal to noise ratio. The low pass filter 475 may, for example, be a FIR filter having a 25 kHz edge and a 30 kHz stop band, which has been found to provide excellent results for data sampled at 88.2 or 96 kHz. FIG. 5 illustrates an example frequency response of an embodiment of the low pass filter 475 applied to a sampling rate of 96 kHz. Using a low-pass filter and a corresponding fixed predictor filter employing control parameters based on the control parameters of the input filter (e.g., the predictor employing filter coefficients based on the frequency response of the input filter) facilitates obtaining a substantial prediction gain for an input signal when a sufficiently high sampling rate is employed, which in turn facilitates obtaining a desired minimum signal to noise ratio. In testing, sampling rates below 48 kHz (e.g., 44.1 and 48 kHz) generally do not provide a sufficient improvement in the gain.

The output of the low pass filter 475 is provided to the adaptive noise shaping filter 480. In some embodiments, the low pass filter 475 may be omitted, and the signal to be encoded may be input to the adaptive noise shaping filter 480 instead of to the low pass filter 475. In some embodiments, the adaptive noise shaping filter 480 may be omitted or selectively bypassed. For example, the adaptive noise shaping filter 480 may be omitted or bypassed when high bit rate signal encoding is employed. In some embodiments, a band pass filter may be employed instead of a low pass filter, with correspond adjustments to the predictor filter. For example, an input filter (e.g., a band pass filter) having fixed control parameters and configured to limit a bandwidth of an input signal to less than seventy-five percent of the available bandwidth based on the sampling frequency may be employed in an embodiment, and the corresponding decoder may include a predictor circuit having fixed control parameters based on a frequency response of the filter. Limiting the bandwidth of the input signal using the input filter and setting the control parameters of the predictor circuit based on a frequency response of the input filter facilitates obtaining a substantial prediction gain for an input signal when a sufficiently high sampling rate is employed, which in turn facilitates obtaining a desired minimum signal to noise ratio.

The adaptive noise shaping filter 480 may be, for example, a low-order all-zero linear prediction filter. Real (not complex) coefficients may be employed. In an embodiment, the adaptive noise shaping filter 480 is an all zero adaptive noise shaping filter which flattens the spectrum of the signal received from the low pass filter 475, while maintaining the overall spectral slope and sufficient masking to maintain a transparent codec (e.g., the compression artifacts are generally imperceptible). In a corresponding decoder (see decoder 700 of FIG. 7), an all-pole filter using the same coefficients may be used to restore the original spectral shape. In an embodiment, the adaptive noise shaping filter 480 preserves the whiteness criteria for the predictor circuit 438. For example, the low-order noise shaping filter 480 may be adjusted to not flatten signals over an edge frequency of a low-pass filter (e.g. 25 kHz, which may not exist in a signal filtered by a low pass filter 475). As noted above, the missing energy at high frequencies facilitates a higher prediction gain. Filters other than linear prediction filters may be employed as the noise shaping filters.

The adaptive noise shaping filter 480 provides a filtered output signal to a positive input 412 of the adder 410. In an embodiment, the adaptive noise shaping filter 480 also provides a signal including adaptive noise filter setting information and/or synchronization information, which may be used to communicate adaptive noise filter setting and synchronization information to a decoder, such as the decoder 700 of FIG. 7, which includes a corresponding inverse noise shaping filter 780. The setting and synchronization information may be transmitted periodically, such as once for every 512 sample block. In some embodiments, the adaptive noise shaping filter control information may be implicit in the code words of the bit stream. For example, when the code words of the bit stream indicate an average bit rate above a threshold average bit rate is being employed, this may also indicate that adaptive noise shaping is being bypassed.

A negative input 414 of the adder 410 receives a prediction signal generated by the decoder 430 as a feedback signal. The adder 410 generates a difference signal which is provided to the variable rate adaptive quantizer circuit 420.

The variable rate adaptive quantizer circuit 420 generates an output signal representing the difference signal as a series of quantization signals or words. The size of the quantization signals is not fixed, and the average length may be adjusted using the output of a multiplier table of a step size and average bit rate controller 440, as discussed in more detail below. The output of the variable rate adaptive quantizer circuit 420 is provided to the step size and average bit rate controller 440, the inverse quantizer 434 and the coder 450.

The quantizer step and average bit rate control circuit 440 generates one or more control signals to control a size of the quantization steps. This implicitly determines an average length of the quantization signal employed by the quantizer 420 (and the inverse quantizer 434), which may be varied by adjustment of the multiplier table to facilitate efficient coding in view of an input audio signal having a varying dynamic range.

Figure 6:
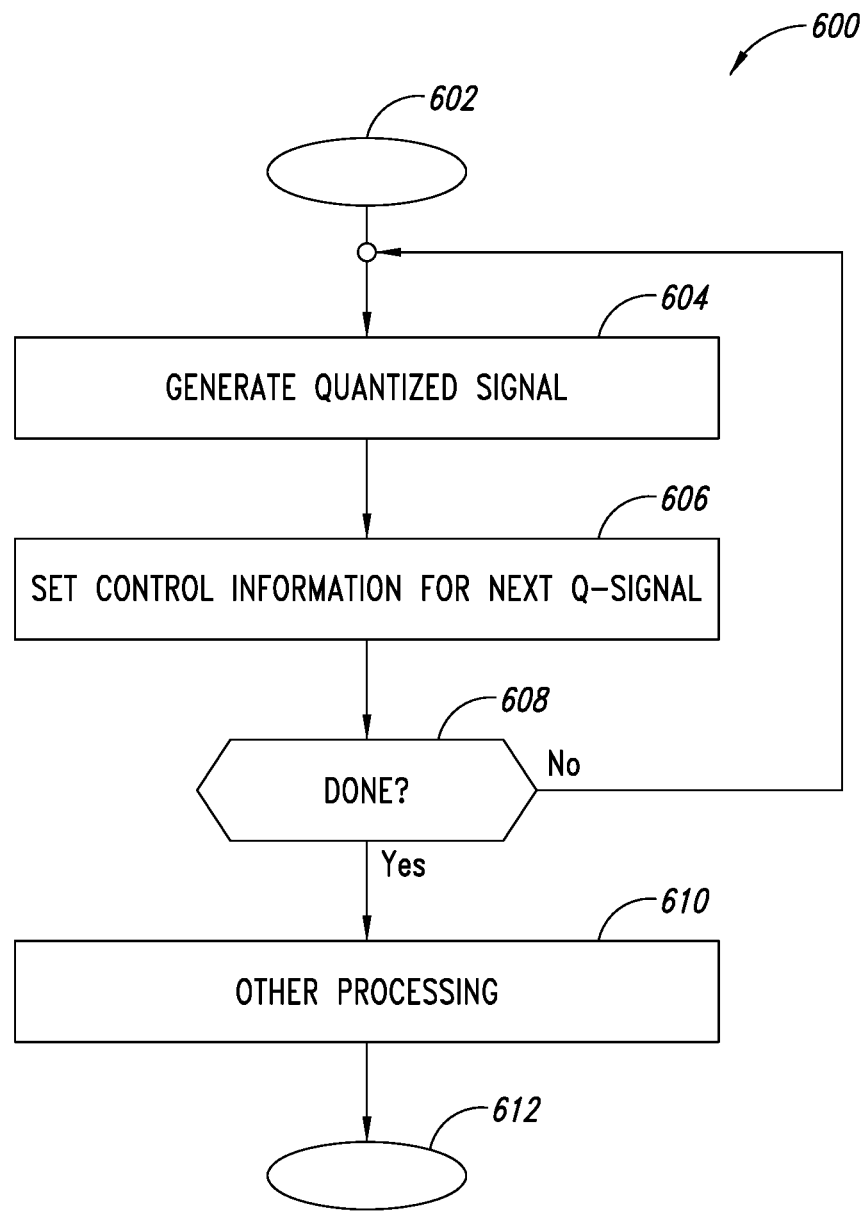
FIG. 6 illustrates an embodiment of a method of controlling changes in adaptive quantizer step sizes.

FIG. 6 illustrates an embodiment of a method 600 of generating code words and controlling changes in step sizes and average bit rate that may be employed, for example, by the encoder 400 of FIG. 4. For convenience, the method 600 will be described with reference to the encoder 400 of FIG. 4. The method starts at 602 and proceeds to 604. At 604, the variable rate adaptive quantizer 420 generates a current quantization signal or word based on the difference signal and the current quantization step size control signal. This may be done, for example, in accordance with equation 2, below:

$$c_n = \lfloor (e_n/\exp(d_n)) \rfloor \qquad \text{Equation 2}$$

where $c_n$ is the current quantized signal, $e_n$ is the error or difference signal, and $d_n$ corresponds to the current step size in the log domain.

The method proceeds from 604 to 606. At 606, the quantizer step size and average bit rate control circuit 440 generates one or more control signals to set the step size for the next quantization signal word. This may be done, for example, in accordance with equation 1, above, or in accordance with equation 3 or 4, below:

$$d_{n+1} = \beta d_n + m(c_n/L_{factor}) \qquad \text{Equation 3}$$

where $c_n$ is the current quantization signal, $d_n$ corresponds to the current step size and responsively the bit length, $L_{factor}$ is a loading factor which is used to control the average bit length (and hence the average bit rate), $m(c_n/L_{factor})$ is the log multiplier selected based on the current quantized signal and the loading factor, and $\beta$ is the leakage coefficient. In some embodiments, a minimum step size $d_{min}$ in the log domain may be set, as follows:

$$d_{n+1} = \max(\beta d_n + m(c_n/L_{factor}), d_{min}) \qquad \text{Equation 4}$$

The loading factor $L_{factor}$ may be selected so as to maintain a desired average bit rate. The load factor may typically be between 0.5 and 16. In some embodiments, a maximum step size may be employed. Changing the log multiplier $m(c_n/L_{factor})$ changes the bit rate and step size, and the values stored in the look-up-table of the log multiplier selector (see FIG. 8) may be selected so as to cause the adaptive quantizer 420 and inverse quantizer 434 to implement the desired changes in the step size and bit rate. For example, higher log multipliers may indicate an increased step size and lower bit rate to the quantizer 420 and inverse quantizer 434. The look-up table may be indexed based on the result of the current quantization value $c_n$ divided by the loading factor $L_{factor}$. Different look-up tables may be employed instead of or in addition to different loading factors in lieu of $L_{factor}$. In an embodiment, values in a look-up-table may be selected such that the log multiplier monotonically increases as the current quantization value $c_n$ increases, and the table of multipliers may go from a negative value for small $c_n$ to a positive value for large $c_n$.

The method 600 proceeds from 606 to 608. At 608 the encoder 400 determines whether to continue encoding of a received signal. When it is determined at 608 to continue encoding of a received signal, the method returns to 604 to process the next quantized signal word. When it is not determined at 608 to continue encoding of a received signal, the method proceeds to 610, where other processing may occur, such as generating an escape code to indicate the received signal has terminated, etc. The method proceeds from 610 to 612, where the method 600 terminates.

Some embodiments of an encoder 400 may perform other acts not shown in FIG. 6, may not perform all of the acts shown in FIG. 6, or may perform the acts of FIG. 6 in a different order.

With reference to FIG. 4, the inverse quantizer 434 of the decoder 430 generates a signal, such as an analog signal, based on the quantized signal output $c_n$ by the variable rate adaptive quantizer 420 and the current step size $d_n$. The predictor circuit 438 may generate the prediction signal based on the output signal of the inverse quantizer 434 and historical data, such as recent coded data and recent prediction values, as discussed in more detail below with reference to FIG. 7. The predictor circuit 438 may employ a FIR filter with coefficients selected based on the frequency response of the low-pass filter 475, as discussed in more detail below with reference to FIG. 7. These coefficients may be fixed, and may be selected so as to facilitate maintaining a sufficient signal to noise ratio for anticipated input signal characteristics. Testing has shown using fixed coefficients for the FIR filter in the predictor circuit 438 based on the frequency response of the low-pass filter 475 resulted in a significant improvement in the signal to noise ratio for signals at and above 64 kHz. For example, attenuating the energy above 25 kHz in the low-pass filter 475 and selecting fixed coefficients of the FIR filter based on the frequency response of the low-pass filter may result in a prediction gain of 45 dB in an embodiment. Using an eight-bit quantizer (see adaptive quantizer 120 of FIG. 1, which may be an eight-bit quantizer, a four-bit quantizer, etc.), may result in a signal to noise ratio comparable to encoding without using an adaptive noise shaping filter (see FIG. 1), but without including frequencies above 25 kHz.

In an embodiment, the quantized signal output by the variable rate adaptive quantizer circuit 420 (or of the optional coder 450 when a coder is employed) is the output quantized signal of the encoder 400. Optionally, coding, such as Huffman coding and/or arithmetic coding, may be employed on the quantized signal in an embodiment, by coding circuit 450, generating a coded signal output of the encoder 400. The coder 450 converts quantized signal words into code words, for example, using one or more look-up tables. Quantized signal words which are used less frequently may be assigned to larger code words, and quantized signal words which are used more frequently may be assigned to smaller code words to increase the efficiency of the coder 400.

The coder 450 optionally provides escape coding in an embodiment. For example, for a quantized value which is not included in the code book employed (e.g., a Huffman codebook), an escape code may be sent instead of a code word from the code book, with the escape coding indicating how the quantized signal value or information will be transmitted (e.g., that the actual quantized signal is being transmitted, that the next code word is the quantized signal value instead of a code word, that a difference between a maximum/minimum level is being transmitted, etc.). In another example, an escape code may indicate that a channel of an encoded signal is being discontinued or is not present (e.g., only one channel of a stereo signal is being encoded). In another example, an escape code may indicate an end of an encoded signal.

The bit stream assembler 485 receives the code words output by the coder 450 and the adaptive noise shaping filter control/synchronization information output by the adaptive noise shaping filter 480 and assembles a bit stream for transmission to a decoder and/or storage. In some embodiments, data packets may be assembled by the bit stream assembler 485, such as packets including a 512 sample block and adaptive noise shaping filter control/synchronization information for the sample block.

Figure 7:
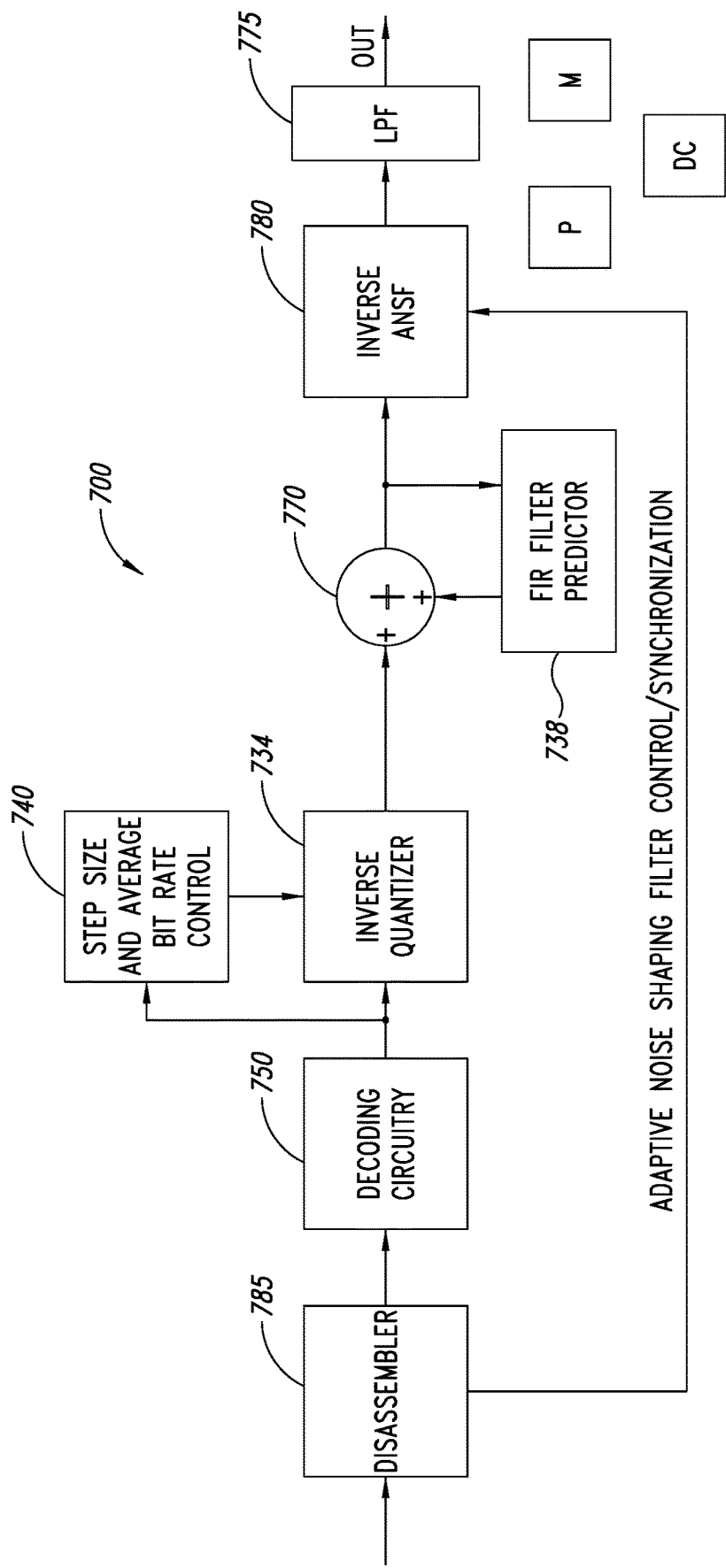
FIG. 7 is a functional block diagram of an embodiment of an ADPCM decoder.

FIG. 7 is a functional block diagram of an embodiment of an audio signal decoder 700 which may employ adaptive differential pulse-code modulation (ADPCM). The decoder 700 may be employed, for example, as the decoder 430 of FIG. 4, as a separate decoder to decode a received encoded signal, etc. As illustrated in FIG. 7, the decoder 700 has a bit stream disassembler 785, optional code word decoding circuitry 750, an inverse quantizer circuit 734, a predictor circuit 738, an inverse quantizer step size and average bit rate control circuit 740, an adder 770, an inverse adaptive noise shaping filter 780 and a low pass filter 775.

In operation of an embodiment, an assembled signal is received by the bit stream disassembler 785 and split into a coded signal component and an adaptive noise shaping filter control and synchronization signal component. The coded signal component is provided to the decoding circuitry 750, which converts the coded signal into a quantized signal $c_n$. Escape coding may be used in an embodiment, as discussed above with reference to the coder 450 of FIG. 4. The quantized signal to be decoded is provided to the inverse quantizer 734 and to the inverse quantizer step size and average bit rate control circuit 740. When the decoder 700 is employed in an encoder, such as the encoder 400 of FIG. 4, the decoding circuitry 750 may typically be omitted and the same step size and average bit rate control circuit may be used to provide a step size control signal to the quantizer and to the inverse quantizer (see, FIG. 4).

The inverse quantizer 734 generates a signal, such as an analog signal, based on the quantized signal output by the decoding circuitry 750 (or received from a quantizer (see quantizer 420 of FIG. 4)) and the current step size set by the inverse quantizer step size and average bit rate control circuit 740. The output of the inverse quantizer 734 is provided to a first positive input of the adder 770. The output of the adder 770 is provided to the predictor 738, which as illustrated comprises a Finite Impulse Response (FIR) filter. An output of the FIR filter is provided to a second positive input of the adder 770.

When the decoder 700 is employed as a decoder to provide a decoded signal as an output, the output of the decoder 700 is provided to an inverse filter, as illustrated an inverse adaptive noise shaping filter 780. The inverse adaptive noise shaping filter 780 may be, for example, a low-order all pole linear prediction filter. In an embodiment, the inverse adaptive noise shaping filter 780 is an all-pole adaptive noise shaping filter which restores the spectrum of the signal using the using the same coefficients used by a corresponding adaptive noise shaping filter of a corresponding encoder (e.g., the adaptive noise shaping filter 480 of FIG. 4) as the coefficients of the all-pole filter. This information may be conveyed in the bitstream and provided to the inverse adaptive noise shaping filter 780 by the disassembler 785. The setting and synchronization information may be provided periodically, such as once for every 512 sample block. In some embodiments, the inverse adaptive noise shaping filter control information may be implicit in the code words of the bit stream, for example, as discussed above with reference to FIG. 4.

The output of the inverse adaptive noise shaping filter 780 is optionally filtered by a low-pass filter 775. This facilitates removing high-frequency energy restored when the original spectrum of the signal is restored by the inverse adaptive noise shaping filter 780. In an embodiment, the low-pass filter 775 of the decoder 700 may employ the same coefficients used by a corresponding low-pass filter of an encoder (e.g., the low-pass filter 475 of FIG. 4).

When the decoder 700 is employed in an encoder as part of a feedback loop, such as the decoder 430 used in the encoder 400 of FIG. 4, the output of the predictor circuit 738 provides the prediction signal to the encoder (see the prediction signal provided to the negative input 414 of the adder 410 of FIG. 4).

The inverse quantizer 734, the inverse quantizer step and average bit rate control circuit 740 and the predictor circuit 738 may typically operate in a similar manner to the corresponding components of an encoder, such as the encoder 400 of FIG. 4. For example, with reference to FIGS. 4 and 7, having the corresponding components operate in a similar manner in the encoder 400 and the decoder 700 facilitates using the quantized signal to generate the prediction signal and to control the step size and average bit rate in both the encoder 400 and the decoder 700, without needing to exchange additional control signals between the encoder 400 and the decoder 700. For example, a system including an embodiment of the encoder 400 and an embodiment of the decoder 700 may operate using the same control parameters for the corresponding components (e.g., using the same filter coefficients).

As illustrated, the decoder 700 of FIG. 7 comprises one or more processors or processor cores P, one or more memories M, and discrete circuitry DC, which may be used alone or in various combinations to implement the functionality of the decoder 700. Although the components of the decoder 700 of FIG. 7 are illustrated as separate components, the various components may be combined (e.g., the inverse quantizer step and average rate control circuit 740 may be integrated into the inverse quantizer 734 in some embodiments) or split into additional components (e.g., the predictor circuit 738 may be split into separate components, such as filters, adders, buffers, look-up tables, etc.) and various combinations thereof.

Figure 8:
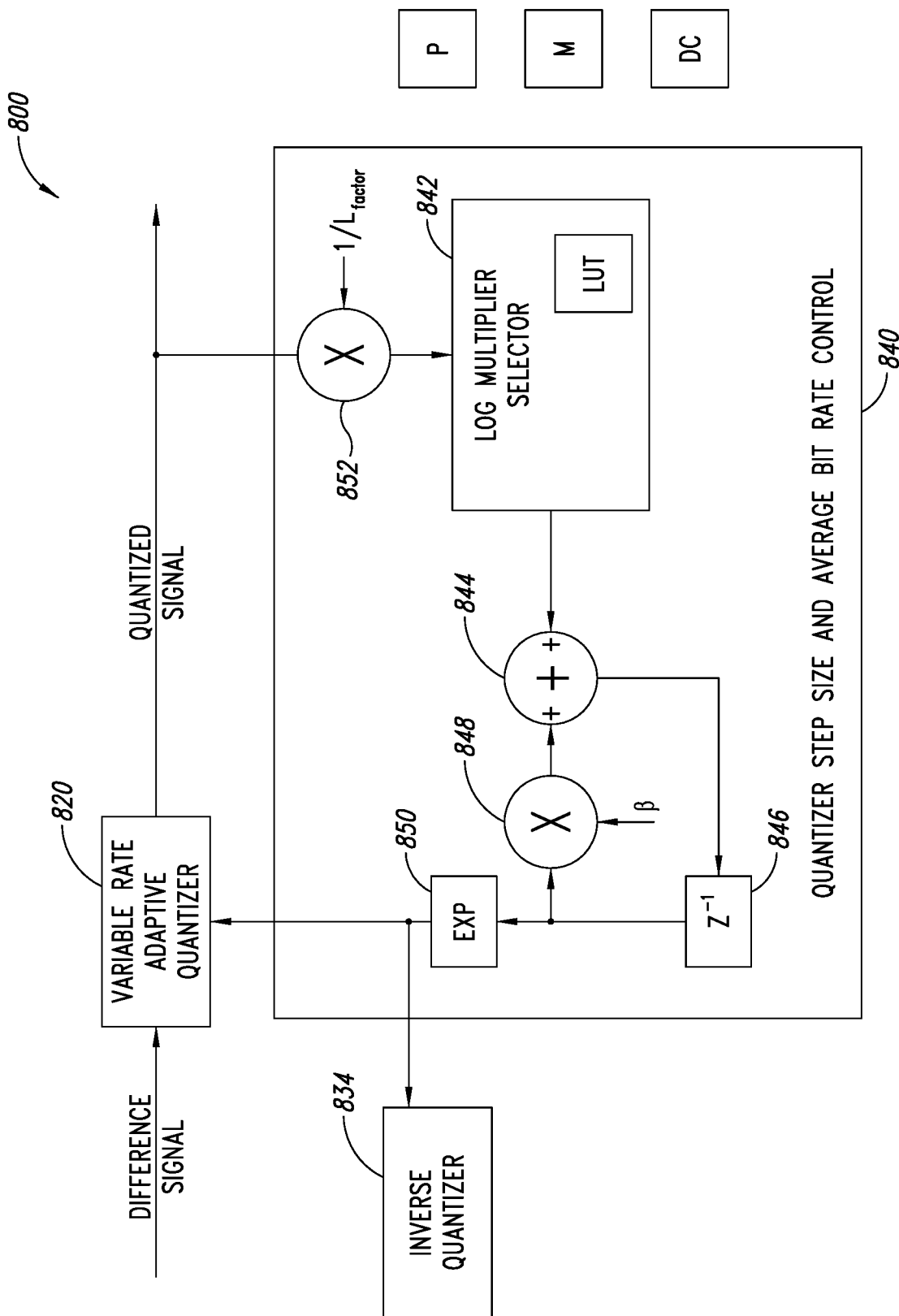
FIG. 8 is a functional block diagram of an embodiment of a quantizer step size and bit rate control circuit.

FIG. 8 is a functional block diagram of an embodiment of a quantizer step size and average rate control circuit 840, which may be employed, for example, in the embodiment of the encoder 400 of FIG. 4 as the quantizer step size and average bit rate control circuit 440, or in the embodiment of the decoder 700 of FIG. 7 as the inverse quantizer step size and average bit rate control circuit 740. As illustrated, the quantizer step size and average bit rate control circuit 840 comprises a multiplier 852, which receives a current quantized signal word $c_n$ and an inverse of a loading factor $L_{factor}$, and a log multiplier selector 842 which selects a log multiplier based on the current quantized signal word and the loading factor. As illustrated the current quantized signal word is a word output by variable rate adaptive quantizer 820. In some embodiments, the current quantized signal word may be included in a bit stream being decoded by a decoder (see FIG. 7). The log multiplier selector 842 may select a log multiplier based on historical data, such as previous quantized signal words, and may comprise a look-up table LUT, which may be updatable, for example, based on historical data, in a update download, etc. The log multiplier selector 842 may select a log multiplier based on statistical probabilities based on current and previous quantized signal words. The quantized step size and average bit rate control circuit 840 comprises an adder 844 which receives at a first positive input the selected log multiplier, and provides an output to a delay circuit 846. The output of the delay circuit 846 is provided to a multiplier 848 and to an exponential circuit 850. The multiplier 848 multiplies the output of the delay circuit 846 by a scaling or leakage factor $\beta$, which may typically be close to and less than 1, and provides the result to a second positive input of the adder 844. The leakage factor may typically be a constant, but may be variable in some embodiments, for example, based on the previous step size control signal or other historical data. The selection of a scaling factor $\beta$ as close to and less than 1 facilitates reducing the impact of selection of an incorrect step size, for example due to a transmission error, as the introduced error will decay away.

The exponential circuit 850, in operation, generates a step-size control signal based on the output of the delay circuit 846. As illustrated, the step-size and average bit rate control signal is provided to a variable rate adaptive quantizer 820 and to an inverse quantizer 834. As illustrated, the quantizer step size and average bit rate control circuit 840 operates in a logarithmic manner, which may simplify the calculations. Some embodiments may operate in a linear manner, and may, for example, employ a multiplier instead of the adder 844, and an exponential circuit instead of the multiplier 846, etc. The step-size and average bit rate control circuit as illustrated operates in a logarithmic manner, and the step sizes selected based on the step size control signal vary in an exponential manner. In an embodiment, the quantizer step size and average bit rate control circuit 840 may operate in accordance with equations 3 or equation 4, and select log multiplier values to populate the look-up tables as discussed above in more detail with reference to FIGS. 4 and 6.

As illustrated, FIG. 8 comprises one or more processors P, one or more memories M, and discrete circuitry DC, which may be used alone or in various combinations to implement the functionality of the quantizer step size and average bit rate control circuit 840. The illustrated components, such as adders, multiplier, etc., may be implemented in various ways, such as, using discrete circuitry, executing instructions stored in a memory, using look-up tables, etc., and various combinations thereof.

Figure 9:
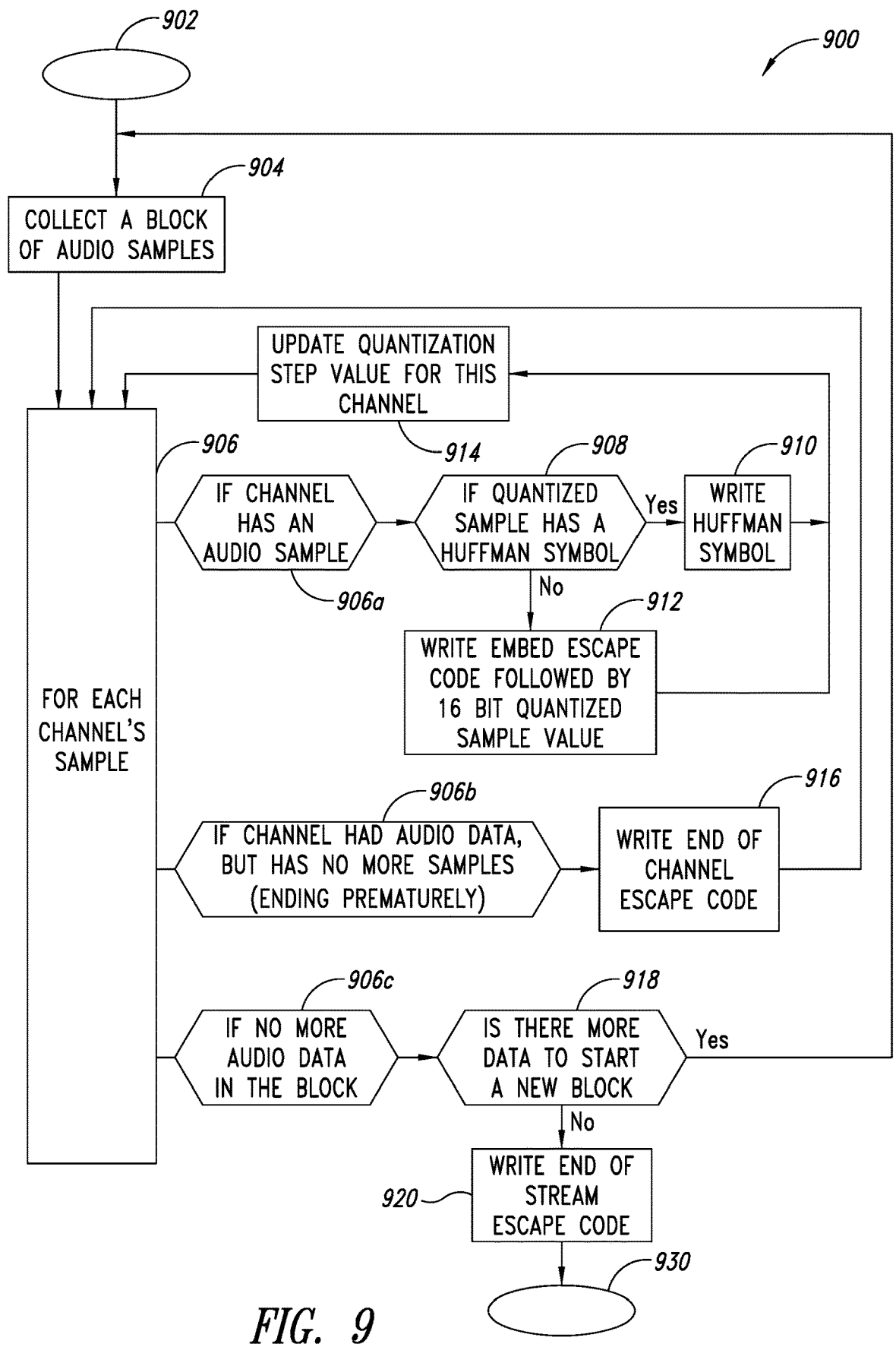
FIG. 9 illustrates an embodiment of a method of generating code words and controlling changes in adaptive quantizer step sizes.

FIG. 9 illustrates an embodiment of a method 900 of generating code words from an audio signal and controlling changes in quantizer step sizes and average bit rate that may be employed, for example, by the encoder 400 of FIG. 4 when escape coding is employed. For convenience, the method 900 will be described with reference to the encoder 400 of FIG. 4. The method starts at 902 and proceeds to 904. At 904, the encoder 400 collects a block of audio samples and proceeds to 906. At 906, the encoder 400 processes a sample of each channel. Parallel processing of the samples of the channels may be employed.

At 906a, the adaptive quantizer 420 determines whether the channel has an audio sample to be processed. If the channel has an audio sample, the method 900 proceeds from 906a to 908. At 908 the coder 450 determines whether a quantized sample has a corresponding symbol in a code book, as illustrated, a Huffman code book. When it is determined that the quantized sample has a corresponding symbol in the code book, the method proceeds from 908 to 910. At 910, the coder 450 writes the corresponding symbol into the bitstream. The method 900 proceeds from 910 to 914.

When it is not determined at 908 that the quantized sample has a corresponding symbol in the code book, the method 900 proceeds from 908 to 912. At 912, the coder writes an embed escape code and a quantized sample value into the bitstream, as illustrated an embed escape code followed by a 16 bit quantized sample value. Other methods of transmitting a quantized sample value without a corresponding code word in the code book may be employed, as discussed in more detail above. The method proceeds from 912 to 914.

At 914, the step-size and average bit rate control circuit 440 updates the step size control signal for the corresponding channel, as discussed in more detail above. For example, the equations 1, 3 and 4 may be employed. The method 900 proceeds from 914 to 906 to process the next sample for the channel.

At 906b, the adaptive quantizer determines whether the channel had audio data, but has no more samples in the block to be processed. For example, a channel may have ended prematurely. When it is determined that the channel has no more samples in the block, the method 900 proceeds from 906b to 916. At 916, the coder 450 writes an end-of-channel escape code into the bitstream and processing of the channel in the current block terminates. The method 900 proceeds from 916 to 906.

At 906c, the encoder 400 determines whether all the audio data in the block for all of the channels has been processed. When it is determined at 906c that all the audio data in the block has been processed, the method 900 proceeds from 906c to 918. At 918, the encoder 400 determines whether there is more data to start a new block. When it is determined at 918 that there is more data to start a new block, the method 900 proceeds from 918 to 904, where the next block of audio samples is processed. When it is not determined at 918 that there is data to start a new block, the method proceeds to 920. At 920, the coder 450 writes an end of stream escape code into the bit stream. The method proceeds from 920 to 930, where processing of the audio signal terminates.

Some embodiments of an encoder 400 may perform other acts not shown in FIG. 9, may not perform all of the acts shown in FIG. 9, or may perform the acts of FIG. 9 in a different order.

Figure 10:
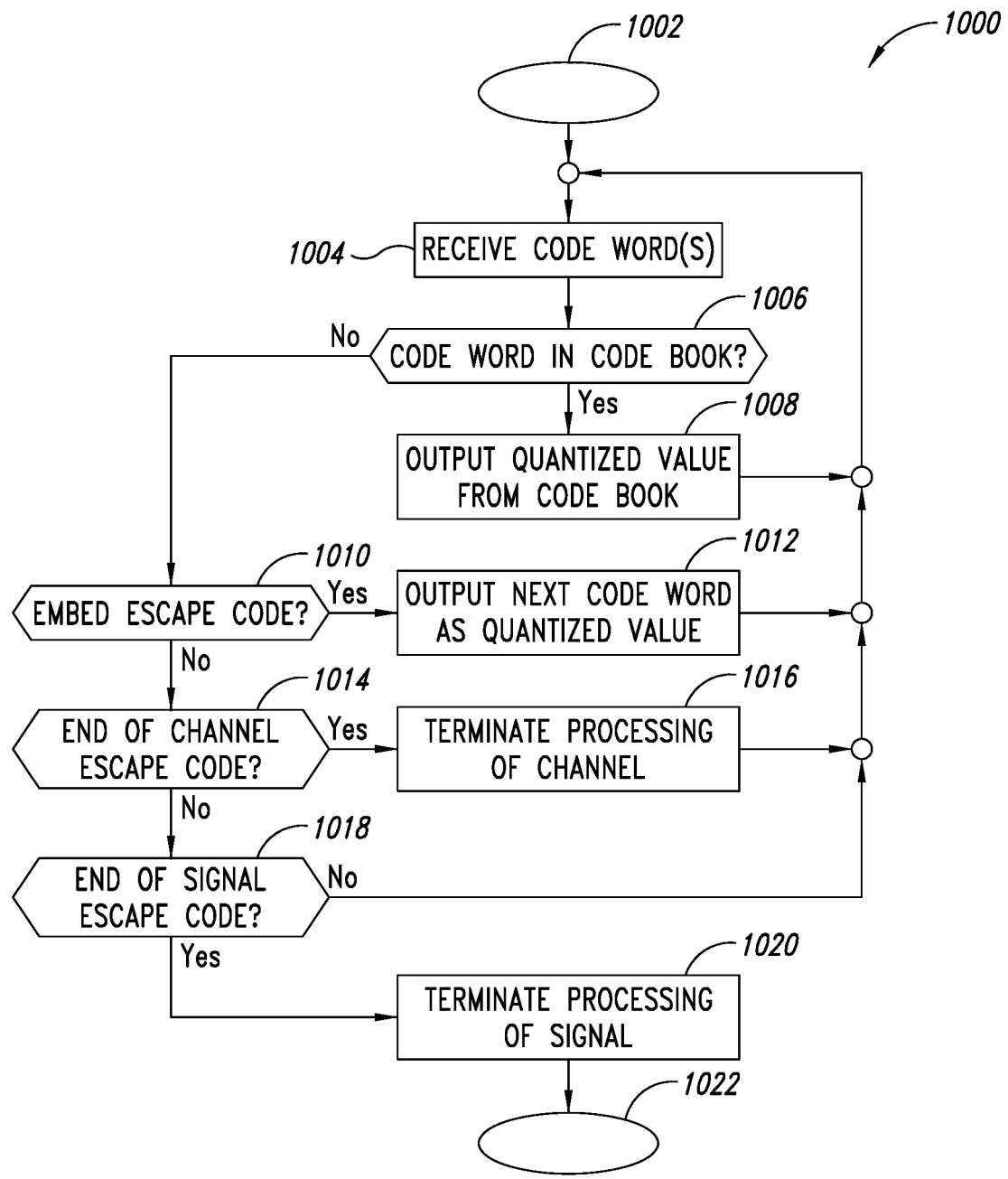
FIG. 10 illustrates an embodiment of a method of generating a quantized signal value from a code word.

FIG. 10 illustrates an embodiment of a method 1000 of generating a quantized signal value from a code word that may be employed, for example, by the decoder 700 of FIG. 7 when escape coding is employed. The method 1000 may process code words for multiple channels of a signal in parallel. For convenience, the method 1000 will be described with reference to the decoder 700 of FIG. 7. The method starts at 1002 and proceeds to 1004. At 1004, the decoding circuitry 750 receives a code word (or code words when multiple channels are being processed in parallel) and proceeds to 1006.

At 1006, the decoding circuitry 750 determines whether the code word (symbol) has a corresponding quantized sample value in a code book, such as a Huffman code book. When it is determined that the code word (symbol) has a corresponding quantized sample value in a code book, the method 1000 proceeds from 1006 to 1008, where the corresponding quantized sample value is output by the decoding circuitry 750 as the current quantized signal value $c_n$. The method 1000 proceeds from 1008 to 1004 to process the next code word of the channel (and code words of other channels of the coded signal). When it is not determined at 1006 that the code word (symbol) has a corresponding quantized sample value in a code book, the method 1000 proceeds from 1006 to 1010.

At 1010, the decoding circuitry 750 determines whether the code word is an embed escape code. When it is determined at 1010 that the code word is an embed escape code, the method 1000 proceeds from 1010 to 1012, where the next code word of the channel is output by the decoding circuitry 750 as the current quantized signal value $c_n$. The method 1000 proceeds from 1012 to 1004 to process the next code word of the channel (and code words of other channels of the coded signal). When it is not determined at 1010 that the code word is an embed escape code, the method 1000 proceeds from 1010 to 1014.

At 1014, the decoding circuitry 750 determines whether the code word is an end of channel escape code. When it is determined at 1014 that the code word is an end of channel escape code, the method 1000 proceeds from 1014 to 1016, where processing of the signal channel is terminated. The method 1000 proceeds from 1016 to 1004 to process the next code word of the remaining channels of the signal. When it is not determined at 1014 that the code word is an end of channel escape code, the method 1000 proceeds from 1014 to 1018.

At 1018, the decoding circuitry 750 determines whether the code word is an end of signal escape code. When it is determined at 1018 that the code word is an end of signal escape code, the method 1000 proceeds from 1018 to 1020, where processing of the signal is terminated. The method 1000 proceeds from 1020 to 1022 where the method 1000 terminates. When it is not determined at 1018 that the code word is an end of signal escape code, the method 1000 proceeds from 1018 to 1004 to process the next code word (or block) of the channel (and code words of other channels of the coded signal).

Some embodiments of a decoder 700 may perform other acts not shown in FIG. 10, may not perform all of the acts shown in FIG. 10, or may perform the acts of FIG. 10 in a different order.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus, comprising:
a low-pass filter having a stop band with a bandwidth selected as a function of a sampling rate, wherein the stop band bandwidth is at least 31% of half of the sampling rate, and determined filter coefficients selected as a function of the sampling rate and configured to filter an input signal to generate a low-pass filtered output;
an encoder configured to generate a quantized signal based on a difference signal, the difference signal generated by determining a differential between the low pass filtered output and a prediction signal, the encoder including:
an adaptive quantizer configured to receive the difference signal;
a decoder configured to generate the prediction signal and having an inverse quantizer, the inverse quantizer configured to receive a quantized signal from a variable rate adaptive quantizer, and a predictor circuit, the predictor circuit having determined control parameters based on a frequency response of the low-pass filter as a function of the stop band of the low-pass filter and the determined filter coefficients of the low-pass filter and to generate the prediction signal as a function of the low-pass filtered output, wherein the low-pass filter and the predictor circuit are coupled and the predictor circuit is configured to provide a predetermined prediction gain for the input signal as a function of the stop band of the low-pass filter.

2. The apparatus of claim 1 wherein the determined filter coefficients of the low-pass filter are fixed filter coefficients of the low-pass filter, the predictor circuit comprises a finite impulse response (FIR) filter and the determined control parameters of the predictor circuit comprise fixed filter coefficients of the FIR filter, and wherein the sampling rate is greater than 48 kHz.

3. The apparatus of claim 1, comprising:
an adaptive noise shaping filter coupled between the low-pass filter and the encoder, the adaptive noise shaping filter being configured to flatten signals within a frequency spectrum corresponding to a frequency spectrum of the low-pass filter.

4. The apparatus of claim 3 wherein the adaptive noise shaping filter is configured to not flatten frequencies above an edge frequency of the low-pass filter, and
wherein the adaptive quantizer is coupled to a differential output of the low-pass filter and the predictor circuit.

5. The apparatus of claim 4 wherein the edge frequency is 25 kHz.

6. The apparatus of claim 3 wherein the adaptive noise shaping filter generates a signal indicative of filter coefficients of the adaptive noise shaping filter, the signal indicative of filter coefficients of the adaptive noise shaping filter being included in a bit stream output by the encoder.

7. The apparatus of claim 1 wherein the encoder includes coding circuitry configured to generate code words based on quantized signal words generated by the adaptive quantizer and to encode the quantized signal in the bit stream if a code word is not available.

8. The apparatus of claim 7 wherein the coding circuitry is configured to generate an escape code in response to at least one of:
a quantized signal word not being associated with a corresponding coding code word;
an end of a signal channel of a signal to be encoded; and
an end of the signal to be encoded.

9. The apparatus of claim 7 wherein the coding circuitry is configured to use Huffman coding to generate the code words.

10. The apparatus of claim 1 wherein the adaptive quantizer is a variable rate quantizer.

11. The apparatus of claim 10 wherein a step size and bit rate of the quantized signals generated by the adaptive quantizer are variable.

12. The apparatus of claim 10 wherein the adaptive quantizer is configured to control a step size according to:

$$d_{n+1} = \beta d_n + m(c_n/L_{factor}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal cn and the loading factor $L_{factor}$, $\beta$ is a leakage coefficient, and $d_{n+1}$ corresponds to a step size in the log domain to be applied to a next quantized signal word $c_{n+1}$.

13. The apparatus of claim 10 wherein the adaptive quantizer is configured to control a step size according to:

$$d_{n+1} = \max(\beta d_n + m(c_n/L_{factor}), d_{min}),$$

where cn is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, $d_{min}$ is a threshold step size in the log domain, and $d_{n+1}$ corresponds to a step size in the log domain to be applied to a next quantized signal word $c_{n+1}$.

14. A method, comprising:
filtering an input signal, the filtering including using a low-pass filter having determined filter coefficients and a stop band having a minimum bandwidth of at least half of 31% of a sampling rate of an audio signal to generate a low-pass filtered output; and
encoding the filtered input signal using a feedback loop, the encoding including:
generating a quantized signal based on a difference signal using an adaptive quantizer, the difference signal generated by determining a differential between the low pass filtered output and a prediction signal; and
generating the prediction signal using a decoder having an inverse quantizer configured to receive a quantized signal from a variable rate adaptive quantizer and a predictor circuit coupled to the low-pass filter and having determined control parameters based on a frequency response of the low-pass filter as a function of the low-pass filtered output, the predictor circuit providing a predetermined prediction gain for the input signal as a function of the stop band of the low-pass filters.

15. The method of claim 14 wherein the determined filter coefficients of the low-pass filter are fixed filter coefficients of the low-pass filter, the predictor circuit comprises a finite impulse response (FIR) filter and the determined control parameters of the predictor circuit comprise fixed filter coefficients of the FIR filter that correlate to the fixed filter coefficients of the low-pass filter.

16. The method of claim 15 wherein the filtering includes using an adaptive noise shaping filter to filter a signal output by the low-pass filter, the adaptive noise shaping filter flattening signals within a frequency spectrum corresponding to a frequency spectrum of the low-pass filter.

17. The method of claim 16, comprising:
generating a signal indicative of filter coefficients of the adaptive noise shaping filter and including the signal indicative of filter coefficients of the adaptive noise shaping filter in an encoded bit stream.

18. The method of claim 14, comprising:
generating code words based on quantized signal words generated by the adaptive quantizer; and
generating the difference signal based on the difference between the feedback signal and the filtered input signal, and wherein the sampling rate is greater than 48 kHz.

19. The method of claim 18, comprising:
generating an escape code in response to at least one of:
a quantized signal word not being associated with a corresponding coding code word and further encoding the quantized signal word into an encoded bit stream;
an end of a signal channel of a signal to be encoded; and
an end of the signal to be encoded.

20. The method of claim 14, comprising:
controlling a step size of the adaptive quantizer according to:

$$d_{n+1}=\max(\beta d_n+m(c_n/L_{factor}),d_{min}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, $d_{min}$ is a threshold step size in the log domain, and $d_{n+1}$ corresponds to a step size in the log domain to be applied to a next quantized signal word $c_{n+1}$.

21. A non-transitory computer-readable medium having contents which configure signal processing circuitry to perform a method, the method comprising:
filtering an input signal, the filtering including low-pass filtering using determined filter coefficients and a stop band having a bandwidth of at least 31% of half of a sampling rate to generate a low-pass filtered output; and
encoding the low-pass filtered output using feedback, the encoding including:
generating a quantized signal based on a difference signal using an adaptive quantizer, the difference signal generated by determining a differential between the low pass filtered output and a prediction signal;
generating a prediction signal using a decoder having an inverse quantizer configured to receive a quantized signal from a variable rate adaptive quantizer and a predictor circuit coupled to the to low-pass filter and having determined control parameters based on a frequency response of the low-pass filtering, the predictor circuit providing a predetermined prediction gain for the input signal as a function of the stop band of the low-pass filter.

22. The non-transitory computer-readable medium of claim 21 wherein the determined filter coefficients of the low-pass filtering are fixed filter coefficients of a low-pass filter, the generating the predictor signal comprises using a finite impulse response (FIR) filter and the determined control parameters comprise fixed filter coefficients of the FIR filter, and the determined filter coefficients are correlated to a sampling frequency.

23. The non-transitory computer-readable medium of claim 22 wherein the filtering includes adaptive noise shaping to flatten signals within a frequency spectrum corresponding to a frequency spectrum of the low-pass filter.

24. The non-transitory computer-readable medium of claim 21 wherein the method comprises:
controlling a step size of the generating of the quantized signal according to:

$$d_{n+1}=\max(\beta d_n+m(c_n/L_{factor}),d_{min}),$$

where $c_n$ is a current quantized signal word, $d_n$ corresponds to a current step size in a log domain, $L_{factor}$ is a loading factor, $m(c_n/L_{factor})$ is a log multiplier selected based on the current quantized signal $c_n$ and the loading factor $L_{factor}$, $\beta$ is a leakage coefficient, $d_{min}$ is a threshold step size in the log domain, and $d_{n+1}$ corresponds to a step size in the log domain to be applied to a next quantized signal word $c_{n+1}$.

25. A system, comprising:
an encoder configured to generate a quantized signal based on a difference signal, the difference signal generated by determining a differential between a low pass filtered output and a prediction signal, the encoder, including:
a low-pass filter having determined filter coefficients and a stop band, wherein a bandwidth of the low-pass filter and the stop band is at least 31% of half of a sampling frequency, and configured to filter an input signal to generate the low-pass filtered output;
an adaptive quantizer configured to generate a quantized signal based on the difference signal;
an inverse quantizer, and
a predictor circuit coupled to the low-pass filter, the inverse quantizer being coupled between the adaptive quantizer and the predictor circuit with the predictor circuit having determined control parameters based on a frequency response of the low-pass filter and to generate a prediction signal as a function of the low-pass filtered output configured to generate a quantized signal based on the difference signal, the difference signal generated by determining a differential between the low pass filtered output and a prediction signal, and the predictor circuit is configured to provide a predetermined prediction main for the input signal as a function of the stop band of the low-pass filter.

26. The system of claim 25 wherein the determined filter coefficients of the low-pass filter are fixed filter coefficients of the low-pass filter that correlate to a sampling frequency, the predictor circuit comprises a finite impulse response (FIR) filter and the determined control parameters of the predictor circuit comprise fixed filter coefficients of the FIR filter that correlate to the fixed filter coefficients of the low-pass filter.

27. The system of claim 25, comprising:
an adaptive noise shaping filter coupled between the low-pass filter and the adaptive quantizer, the adaptive noise shaping filter being configured to flatten signals within a frequency spectrum corresponding to a frequency spectrum of the low-pass filter.

28. The system of claim 27 wherein the adaptive noise shaping filter generates a signal indicative of filter coefficients of the adaptive noise shaping filter, the signal indicative of filter coefficients of the adaptive noise shaping filter being included in a bit stream output by the encoder to the decoder.

29. The system of claim 25 wherein the encoder includes coding circuitry configured to generate code words based on quantized signal words generated by the adaptive quantizer and the input signal if a corresponding code word is not present, and the decoder includes decoding circuitry configured to generate quantized signal words based on code words generated by the coding circuitry or the input signal if the corresponding code word is not present.

30. The system of claim 29 wherein the coding circuitry and the decoding circuitry are configured to use escape coding; and
wherein the adaptive quantizer is coupled to a differential output of the low-pass filter and the predictor circuit.

31. A system, comprising:
an input filter having determined control parameters and a stop band configured to limit a bandwidth of an input signal at least 31% of half of a sampling frequency of the input signal and to generate a low-pass filtered output;
an encoder configured to generate quantized signals based on a difference signal, the difference signal generated by determining a differential between the low pass filtered output and a prediction signal, the encoder including:
an adaptive quantizer configured to receive the difference signal; and
feedback circuitry configured to generate feedback signals and having an inverse quantizer and a predictor circuit, the predictor circuit coupled to the input filter having determined control parameters based on a frequency response of the input filter and to generate the prediction signal as a function of the low-pass filtered output, and to provide a predetermined prediction gain for the input signal as a function of the stop band of the low-pass filter.

32. The system of claim 31, comprising:
a decoder configured to decode signals encoded by the encoder; and
wherein the adaptive quantizer is coupled to a differential output of the input filter and the predictor circuit, and the sampling frequency is greater than 48 kHz.

33. The system of claim 31 wherein the input filter is a low-pass filter, the determined control parameters of the low-pass filter are fixed filter coefficients of the low-pass filter, the predictor circuit comprises a finite impulse response (FIR) filter and the determined control parameters of the predictor circuit comprise fixed filter coefficients of the FIR filter.

34. The system of claim 31 wherein the input filter is a band-pass filter, the determined control parameters of the band-pass filter are fixed filter coefficients of the band-pass filter, the predictor circuit comprises a finite impulse response (FIR) filter and the determined control parameters of the predictor circuit comprise fixed filter coefficients of the FIR filter.

* * * * *